United States Patent [19]

Sari

[11] Patent Number: 4,889,070
[45] Date of Patent: * Dec. 26, 1989

[54] SYSTEM FOR THE TREATMENT OF EDGE SUPPORTED SUBSTRATES

[76] Inventor: Eric T. Sari, P.O. Box 41887, Plymouth, Minn. 55441

[*] Notice: The portion of the term of this patent subsequent to Jun. 16, 2004 has been disclaimed.

[21] Appl. No.: 918,509

[22] Filed: Oct. 10, 1986

Related U.S. Application Data

[63] Continuation-in-part of Ser. No. 840,311, Mar. 14, 1986, Pat. No. 4,672,914, which is a continuation-in-part of Ser. No. 775,636, Sep. 13, 1985, Pat. No. 4,643,129.

[51] Int. Cl.⁴ ............................................. B05C 11/00
[52] U.S. Cl. .................................... 118/64; 118/324; 118/500; 134/127; 198/817
[58] Field of Search .............. 118/64, 324, 641, 500; 134/127; 198/817, 476

[56] References Cited

U.S. PATENT DOCUMENTS

| | | | |
|---|---|---|---|
| 3,310,431 | 3/1967 | Loose | 118/52 |
| 3,421,924 | 1/1969 | Harlam et al. | 118/52 X |
| 3,809,011 | 5/1974 | Fabre et al. | 118/301 X |
| 4,418,815 | 12/1983 | Anderson et al. | 198/484.1 |
| 4,422,541 | 12/1983 | Lisec | 198/817 X |
| 4,542,820 | 9/1985 | Maxner | 198/817 |

Primary Examiner—Shrive Beck
Assistant Examiner—Alain Bashore

[57] ABSTRACT

A system for the thermal and/or liquid treatment of edge supported substrates, such as printed electronic circuit boards and hybrid circuits. The system includes an elongated tunnel treating chamber. The system includes a conveyor system comprised of a pair of lubricant-free tape conveyors supported for movement through the treating chamber on a plurality of spaced apart parallel pins extending laterally inwardly from a pair of parallel elongated rail tracks. A lip on the rail track is closely spaced from and partially overlies the tape conveyor. The lubricant-free tape conveyor is comprised of a closed loop flexible steel tape provided with a plurality of longitudinally spaced apart vertical tabs throughout its length. The tabs are in longitudinal alignment, spaced inwardly from the edges of the tape and provide lateral support for substrates suspended between a pair of conveyor tapes.

15 Claims, 1 Drawing Sheet

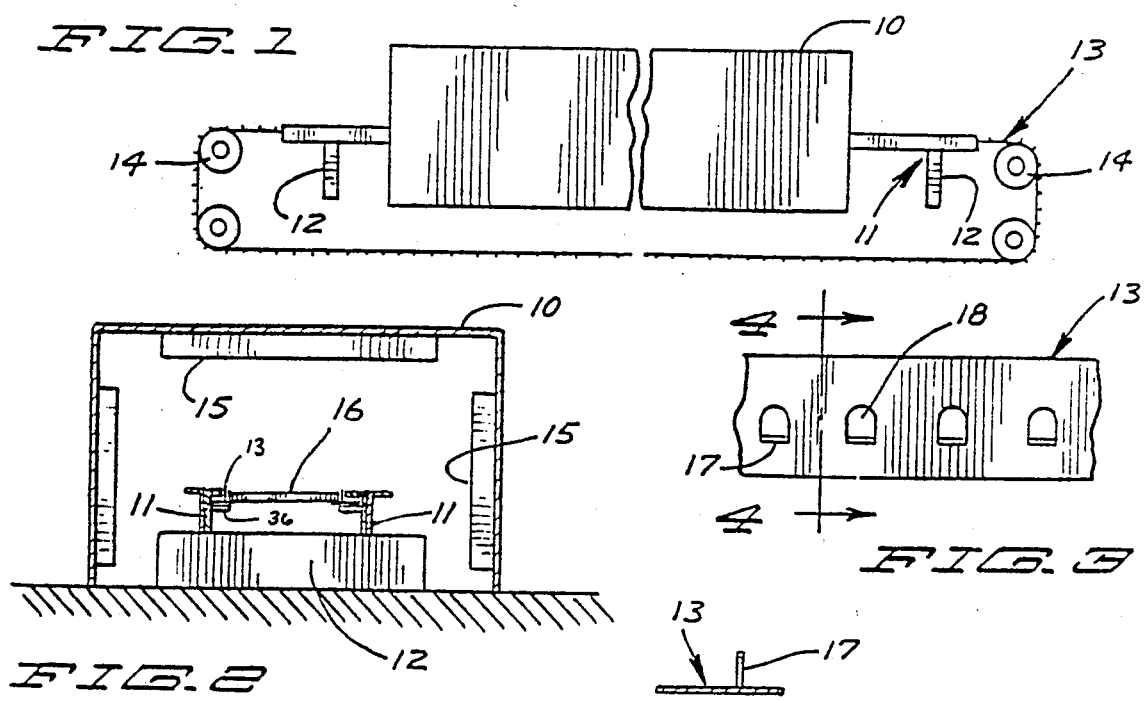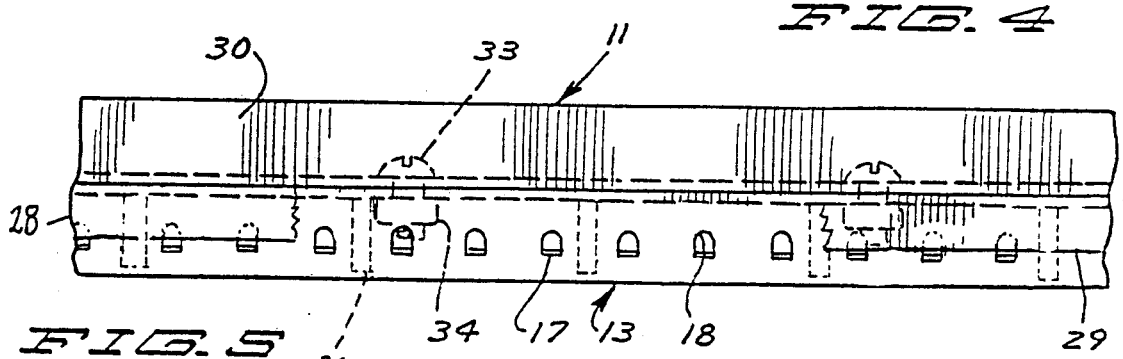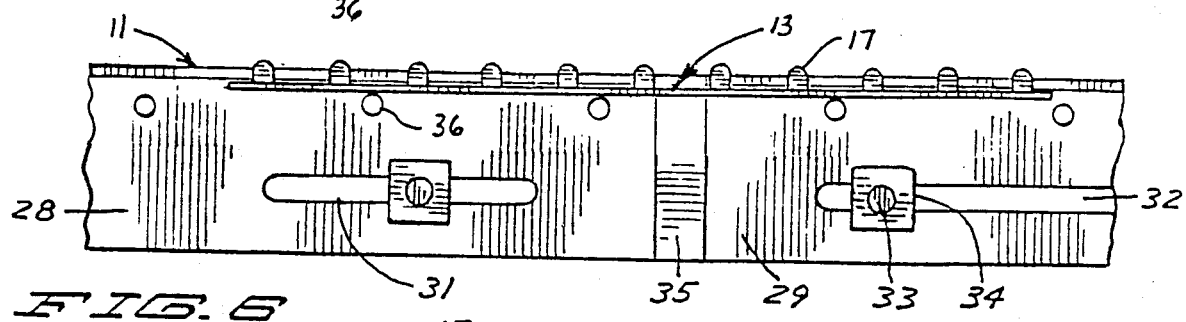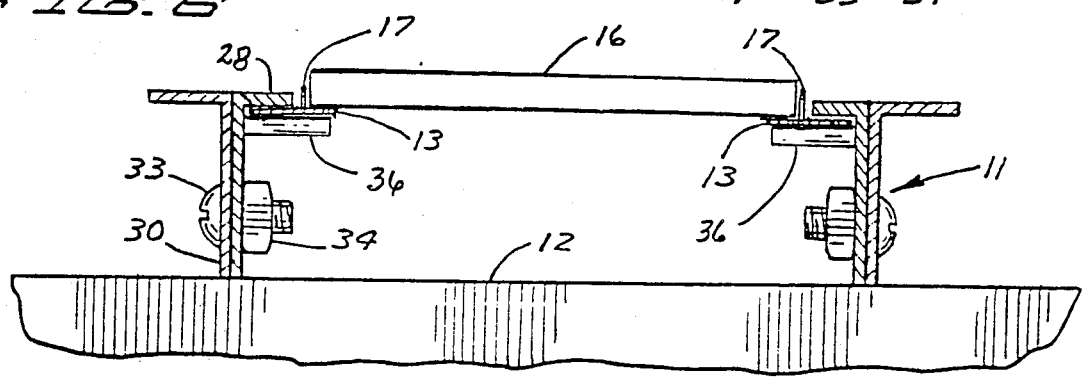

SYSTEM FOR THE TREATMENT OF EDGE SUPPORTED SUBSTRATES

This application is a continuation-in-part of application Ser. No. 840,311, filed Mar. 14, 1986, now U.S. Pat. No. 4,672,914 which in turn is a continuation-in-part of application Ser. No. 775,636, filed Sept. 13, 1985, now U.S. Pat. No. 4,643,129.

BACKGROUND OF THE INVENTION

1. Field of the Invention

This invention is directed to a system for the thermal and/or liquid treatment of edge supported substrates, such as printed electronic circuit boards and the like, and especially as applied to surface mount technology. More particularly, the invention is directed to a novel lubricant-free flexible steel tape conveyor having projecting tabs providing lateral support for the circuit boards or hybrid circuits or similar substrates suspended between the tapes by their edges in the course of passage through thermal and/or liquid treatment.

In the manufacture of printed circuit boards or hybrid circuits, it is common practice to subject the boards to successive liquid and thermal treatment steps including solvent degreasing, spray coating, drying, baking, and the like. Such treatments are difficult to carry out on a continuous basis utilizing available conveyor systems since the treatments have a deleterious effect on the conveyor systems, as by removing lubricant, baking and solidifying lubricant, and the like. The present invention is directed toward alleviation of the deficiencies of the prior art.

2. The Prior Art

According to current practice, circuit boards are transported through treating chambers by means of full product width wire mesh conveyor belts or roller-type chain conveyors. The successive hubs of a roller chain are provided with projecting pins. Panels to be treated are supported on those pins between a pair of chains and carried through a treating chamber. Such conveyors tend to fail through loss of lubricant in solvent degreasing treatments, by congealing of the lubricant in heating treatments, and the like.

In my aforesaid copending application Ser. No. 840,311, there is disclosed a system for the thermal and/or liquid treatment of edge supported substrates alleviating the problems of the prior art. The system includes an elongated tunnel treating chamber provided with elements for liquid and/or thermal treatment of substrates carried through the treating chamber. The conveyor system for transporting material through the treating chamber includes a pair of elongated rail tracks extending through the treating chamber. These rail tracks are supported by members disposed outside of the treating chamber at the opposite ends of the chamber. A lubricant-free flexible steel tape conveyor is provided on each rail track. Each tape is provided with a plurality of longitudinally spaced apart vertical tabs throughout its length. The tabs are in longitudinal alignment, spaced inwardly from the edges of the tape and provide lateral support for substrates suspended between the pair of conveyor tapes. Means are provided for moving the conveyor along the rail tracks through the treating chamber.

In the system of my aforesaid application, the tape conveyor travels through the treating chamber with the bottom surface of the tape in face-to-face sliding contact with the upper surface of the supporting rail track. When the system is used for thermal treatment of substrates, after prolonged heating the rail track may become excessively hot. This may cause buckling and warping of the conveyor tape.

SUMMARY OF THE INVENTION

The present invention is directed to an alternative and improved system for the thermal and/or liquid treatment of edge supported substrates alleviating the problems of the prior art, and the effect of excess heating of the conveyor supporting rail track of the system of my aforesaid application. The system includes an elongated tunnel treating chamber provided with elements for liquid and/or thermal treatment of substrates carried through the treating chamber. The conveyor system for transporting material through the treating chamber includes a pair of elongated horizontal rail tracks extending through the treating chamber. These rail tracks are supported by members disposed outside of the treating chamber at the opposite ends of the chamber. A lubricant-free flexible steel tape conveyor is provided for movement along each rail track. Each tape is provided with a plurality of longitudinally spaced apart vertical tabs throughout its length. The tabs are in longitudinal alignment, spaced inwardly from the edges of the tape and provide lateral support for substrates suspended between the pair of conveyor tapes. Each tape is supported for movement by a plurality of spaced apart pins or rods extending transversely across the path of movement of the tape. The tape passes under a partially overlying rail or lip in loose sliding engagement. Means are provided for moving the conveyor along the rail tracks through the treating chamber.

BRIEF DESCRIPTION OF THE DRAWINGS

The invention is described in the accompanying drawings in which corresponding parts are identified by the same numerals and in which:

FIG. 1 is a schematic side elevation of a system according to the present invention comprising a treating chamber, conveyor supporting rail track and drive;

FIG. 2 is a schematic end elevation thereof;

FIG. 3 is a fragmentary plan view of a segment of conveyor tape;

FIG. 4 is a section on the line 4—4 of FIG. 3 and in the direction of the arrows;

FIG. 5 is a fragmentary top plan view of a segment of tape conveyor and supporting rail tracks;

FIG. 6 is a side elevation thereof; and

FIG. 7 is an end elevation showing a pair of conveyor tapes and their support rail tracks supporting a substrate for passage through a treating chamber.

DETAILED DESCRIPTION OF THE PREFERRED EMBODIMENT

Referring now to the drawings, and particularly to FIGS. 1 and 2, there is shown in schematic form a system for treating edge supported substrates in the course of passage through a treating chamber. The system comprises a treating chamber in the form of an open-ended tunnel 10 through which a continuous conveyor passes. A pair of parallel spaced apart horizontal conveyor rail tracks 11 extend through the entire length of the tunnel chamber 10. The opposite ends of rail tracks 11 are supported by horizontal members 12 at the opposite ends of the treatment tunnel. A pair of continuous thin flexible conveyor tapes 13 extend through tunnel chamber 10 supported on rail tracks 11. Conveyor tapes 13 are supported in their passage by sprocket wheels or rollers 14, one of which is driven and provided with cogs or other engaging means to facilitate travel of the conveyor tapes. The inside of the tunnel chamber 10 is provided with thermal and/or liquid treating elements 15 adjacent to the path of the conveyor. These may be, for example, infrared or ultraviolet radiant heating lamps or other heating units, liquid spray heads, or the like. The different treatment elements may be spaced apart within the same long tunnel chamber or in separate chambers, depending upon the requirements of the particular substrate being treated. The substrate 16 is supported by its edges between the conveyor tapes for its passage through the chamber 10.

A preferred form of conveyor tape 13 is shown in FIGS. 3 and 4. The tape is thin, flexible, formed in a closed loop and capable of withstanding high temperature, sol-vent and other chemical treatment, and the like. Desirably, the tape is about ½ to ¾ inch wide and between about 0.002 and 0.004 inch in thickness, preferably about 0.003 inch. For temperatures below about 500° F., an exemplary material is Full Hard 302 stainless steel. For temperatures above about 500° F., an exemplary material is Condition C 700 stainless steel.

Each tape 13 has a single row of a plurality of generally vertically extending tabs 17, all on the same side of the tape. Tabs 17 are in longitudinal alignment spaced inwardly from the edges of the tape. They are uniformly distributed along the tape and longitudinally spaced apart on about ¼ to ½ inch centers. Preferably, the tabs 17 are formed by punching partial longitudinally spaced holes 18 in the tape and bending the tabs to extend generally perpendicular to the tape surface. Although tabs 17 are shown as extending perpendicular to the body of the tape, they may deviate slightly from 90°. For example, to reduce the likelihood of the tabs breaking off, they may be bent up less than 90°, i.e., about 70° to 80°. The tapes are subjected to heat conditioning after formation of the tabs.

Referring now to FIGS. 5 through 7, there is shown the preferred form of conveyor and supporting rail track.

In its passage through a treating chamber, the conveyor 13 is supported on rail track 11. The elongated rail track 11 is composed of two sets of shorter vertically disposed elongated slotted angle rails or bars each assembled in end-to-end relation and in overlapping side-by-side relation. Thus angle rails or bars 28 and 29 are assembled in end-to-end relation and overlap angle bar 30. Tape 13 is supported by a plurality of spaced apart parallel laterally extending rods or pins 36 supported from rails 28 and 29. The pins are in generally horizontal alignment with their longitudinal axes lying in a horizontal plane. Typically pins 36 are spaced on about 2 inch centers, i.e., about 1½ to 2½ inches. The top lips of angle rails or bars 28 and 29 extend laterally beyond the edge of angle bar 30 and overlie tape 13 about half of the width of tape 13 so that tabs 17 are free to move relative to the edges of the rail lips. Thus, the bottom surface of tape 13 engages the top surfaces of pins 36 and about half of the width of the top surface of the tape slides beneath the closely spaced rail lip in loose sliding relation.

Angle bars 28 and 29 are slotted at 31 and 32, respectively, and secured to angle bar 30 by suitable fastening means, such as bolts 33 and nuts 34. To prevent buckling of the track when used in a thermal treating chamber, to allow for expansion, a small gap 35 is left between the ends of adjacent angle bars. In the passage of substrates 16 through the treating chamber, they are loosely supported by being suspended between the laterally spaced apart conveyor tapes and move with the tapes. Tabs 17 keep the substrates in loose alignment by providing lateral support.

It is apparent that man modification and variations of this invention as hereinbefore set forth may be made without departing from the spirit and scope thereof. The specific embodiments described are given by way of example only and the invention is limited only by the terms of the appended claims.

The embodiments of the invention is which an exclusive property or privilege is claimed are defined as follows:

1. A system for the thermal and liquid treatment of edge supported substrates comprising:
    (A) an elongated tunnel treating chamber,
    (B) a pair of elongated rail tracks extending through said chamber,
    (C) support members for said rail tracks outside of said chamber on opposite ends thereof,
    (D) a plurality of spaced apart parallel laterally extending pins projecting inwardly from said rail tracks,
    (E) means on each of said rail tracks overlying and closely spaced from said pins throughout the length of said treating chamber,
    (F) a lubricant-free closed loop tape conveyor on each of said rail tracks, said conveyor having a plurality of longitudinally aligned and longitudinally spaced vertical tabs spaced inwardly from the edges of the tape, said tape being in engagement with the top surfaces of said pins and partially underlying said rail means, whereby a substrate may be supported by its edges between said tapes as the tapes slide in loose sliding relation between said rail means and said pins, and
    (G) means for moving said conveyors along said rail tracks.

2. A system according to claim 1 wherein said tunnel treating chamber includes thermal treating elements adjacent the conveyor path.

3. A system according to claim 2 wherein said thermal treating units are heating units.

4. A system according to claim 1 wherein said tunnel treating chamber includes liquid treating elements adjacent the conveyor path.

5. A system according to claim 4 wherein said liquid treating elements are solvent spray heads.

6. A system according to claim 1 wherein said rail tracks are each composed of one set of a plurality of shorter elongated slotted bars in end-to-end relation secured together in overlapping side-by-side relation with a second set of similar bars, with a small gap between the ends of adjacent bars.

7. A system according to claim 1 wherein the tabs of said conveyor tape are each comprised of a partially punched hole bent to extend generally perpendicular to the surface of the tape.

8. A system according to claim 7 wherein said conveyor tape is composed of stainless steel.

9. A system according to claim 1 wherein said means overlying and closely spaced from said pins comprises a lip extending inwardly from each of said tracks and partially overlying the width of the tape conveyor between its outer edge and said vertical tabs.

10. A lubricant-free conveyor for carrying substrates through a treatment chamber, said conveyor comprising an elongated thin flexible closed loop tape having a single row composed of a plurality of longitudinally aligned and longitudinally spaced uniformly distributed identical generally vertical tabs spaced inwardly from the edges of the tape.

11. A conveyor according to claim 10 wherein the tabs of said conveyor tape are each comprised of a partially punched hole bent to extend generally perpendicular to the surface of the tape.

12. A conveyor according to claim 11 wherein said conveyor tape is composed of stainless steel.

13. A conveyor according to claim 12 wherein said tape is between about 0.002 and 0.004 inch in thickness.

14. A lubricant-free conveyor for carrying substrates through a treatment chamber, said conveyor comprising:
 (A) a pair of parallel spaced apart elongated thin flexible closed loop tapes each having a single row composed of a plurality of longitudinally aligned and longitudinally spaced uniformly distributed identical generally vertical tabs spaced inwardly from the edges of the tape,
 (B) a pair of elongated parallel spaced apart generally horizontal tape supporting rail tracks,
 (C) a plurality of spaced-apart parallel laterally extending pins projecting inwardly from said rail tracks, and
 (D) an inwardly extending lip on each of said rail tracks overlying and closely spaced from said pins, said tape being in engagement with the top surfaces of said pins and partially underlying said rail lips, whereby a substrate may be supported by its edges between said tapes.

15. A lubricant-free conveyor according to claim 14 wherein said conveyor tape is composed of stainless steel between about 0.002 and 0.004 inch in thickness.

* * * * *